(12) United States Patent
Huang et al.

(10) Patent No.: US 10,522,492 B2
(45) Date of Patent: Dec. 31, 2019

(54) SEMICONDUCTOR PACKAGE AND SEMICONDUCTOR PROCESS

(71) Applicant: Advanced Semiconductor Engineering, Inc., Kaohsiung (TW)

(72) Inventors: Wen Hung Huang, Kaohsiung (TW); Yan Wen Chung, Kaohsiung (TW); Chien-Mei Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/614,563

(22) Filed: Jun. 5, 2017

(65) Prior Publication Data

US 2018/0350616 A1 Dec. 6, 2018

(51) Int. Cl.

| | |
|---|---|
| *H01L 23/00* | (2006.01) |
| *H01L 23/522* | (2006.01) |
| *H01L 21/768* | (2006.01) |
| *H01L 23/14* | (2006.01) |
| *H01L 23/04* | (2006.01) |
| *H01L 23/498* | (2006.01) |
| *H01L 21/3213* | (2006.01) |

(52) U.S. Cl.
CPC ........ *H01L 24/13* (2013.01); *H01L 21/76838* (2013.01); *H01L 23/04* (2013.01); *H01L 23/142* (2013.01); *H01L 23/49827* (2013.01); *H01L 23/5226* (2013.01); *H01L 24/10* (2013.01); *H01L 24/20* (2013.01); *H01L 21/32134* (2013.01); *H01L 2224/16225* (2013.01); *H01L 2224/18* (2013.01); *H01L 2224/32225* (2013.01); *H01L 2224/73204* (2013.01); *H01L 2924/15311* (2013.01); *H01L 2924/181* (2013.01)

(58) Field of Classification Search
CPC ......... H01L 23/31053; H01L 21/76838; H01L 23/04; H01L 23/5226; G03F 9/7084
See application file for complete search history.

(56) References Cited

U.S. PATENT DOCUMENTS

| | | | |
|---|---|---|---|
| 9,293,486 B2 * | 3/2016 | Kato | ..................... H01L 27/146 |
| 2002/0061665 A1 * | 5/2002 | Batinovich | ......... H01L 21/4853 439/71 |

(Continued)

*Primary Examiner* — Zandra V Smith
*Assistant Examiner* — Andre C Stevenson
(74) *Attorney, Agent, or Firm* — Foley & Lardner LLP; Cliff Z. Liu

(57) ABSTRACT

A wiring structure includes a dielectric layer and a first patterned conductive layer on the dielectric layer. The dielectric layer has a first region and a second region. The first patterned conductive layer includes a number of fine conductive lines and a number of dummy conductive structures. The number of conductive lines include a first number of conductive lines on the first region and a second number of conductive lines on the second region, and the number of dummy conductive structures include a first number of dummy conductive structures on the second region. The first number of conductive lines occupy a first area on the first region, and the second number of conductive lines and the first number of dummy conductive structures occupy a second area on the second region. A ratio of the second area to the first area is greater than or equal to about 80%.

24 Claims, 10 Drawing Sheets

(56) References Cited

U.S. PATENT DOCUMENTS

| | | |
|---|---|---|
| 2005/0133249 A1 | 6/2005 | Fujii |
| 2008/0029894 A1* | 2/2008 | Wang ................ H01L 23/49822 257/762 |
| 2016/0218072 A1* | 7/2016 | Liao ........................ H01L 23/66 |

* cited by examiner

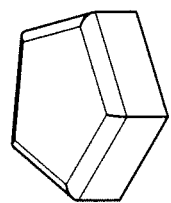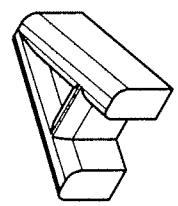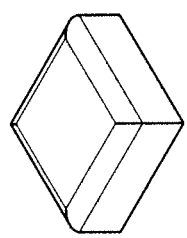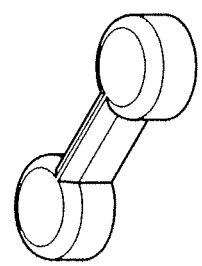
FIG. 8
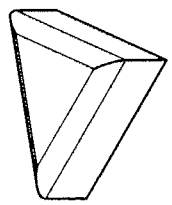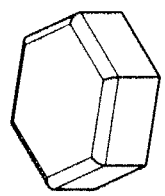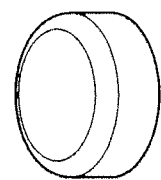

SEMICONDUCTOR PACKAGE AND SEMICONDUCTOR PROCESS

BACKGROUND

1. Technical Field

The present disclosure relates to a wiring structure and a semiconductor package. The present disclosure also relates to a wiring structure having dummy conductive structures, which can help to avoid peeling of conductive lines in the wiring structure.

2. Description of the Related Art

It can be desirable to miniaturize semiconductor devices, in some implementations. Miniaturization of semiconductor devices can help to improve device performance and to reduce device manufacturing cost. Fine pitch technology in wiring design of semiconductor devices can help to miniaturize semiconductor devices. Fine pitch technology can involve a width of a conductive line being less than about 10 micrometers ($\mu m$), or less than about 3 $\mu m$. It is desired to have a width of conductive lines on such a scale.

Wiring design for fine conductive lines can be challenging. In a layout of wiring design, a wiring structure may include a dense region and at least one sparse region. A dense region is a region including relatively more conductive lines in a given area than the sparse region, and a sparse region is a region including relatively less conductive lines in a given area. In a manufacturing process of a wiring structure, a seed layer can be formed prior to the formation of conductive lines, which can be formed by, for example, a plating process. Subsequent to the formation of conductive lines, an etching process can be performed by, for example, a spin coater to remove the exposed seed layer. The amount of metal that is etched away by an etching solution per milliliter is, in some cases, approximately constant. When spin coating is used for etching, the amount of an etching solution used in a dense region and at least one sparse region can thus be constant. In an etching process, the amount of an etching solution for the wiring structure can be determined based on the amount of the etching solution required to etch away the seed layer. In such implementations, the amount of an etching solution applied to the sparse regions may be excessive, and the conductive lines in the sparse region may be over-etched and have a greater critical dimension (CD) loss. Accordingly, the etching process can have different impacts on the conductive lines in the dense regions and the sparse regions.

SUMMARY

In some embodiments of the present disclosure according to a first aspect, a wiring structure comprises a dielectric layer and a first patterned conductive layer on the dielectric layer. The dielectric layer has a first region and a second region. The first patterned conductive layer comprises a number of conductive lines and a number of dummy conductive structures. A width of each of the conductive lines is less than about 10 $\mu m$. The number of conductive lines comprise a first number of conductive lines on the first region and a second number of conductive lines on the second region, and the number of dummy conductive structures comprise a first number of dummy conductive structures on the second region. The number of dummy conductive structures are isolated from each of the number of conductive lines. The first number of conductive lines occupy a first area on the first region, and the second number of conductive lines and the first number of dummy conductive structures occupy a second area on the second region. A ratio of the second area to the first area is greater than or equal to about 80%. In some embodiments, a ratio of the size of the second area to a size of an area of the first region is greater than or equal to about 52%. In some embodiments, a ratio of the size of the first area to a size of an area of the first region is greater than or equal to about 52%. In some embodiments, the second number of conductive lines occupy a third area, and wherein a ratio of a size of the third area to a size of an area of the second region is in a range of about 1.4% to about 52%. In some embodiments, the dielectric layer further comprises a number "m" of third regions, wherein "m" is a positive integer equal to or greater than 14.

In some embodiments of the present disclosure according to a second aspect, a semiconductor package comprises the above-mentioned wiring structure.

BRIEF DESCRIPTION OF THE DRAWINGS

FIG. 8 illustrates various shapes of dummy conductive structures in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
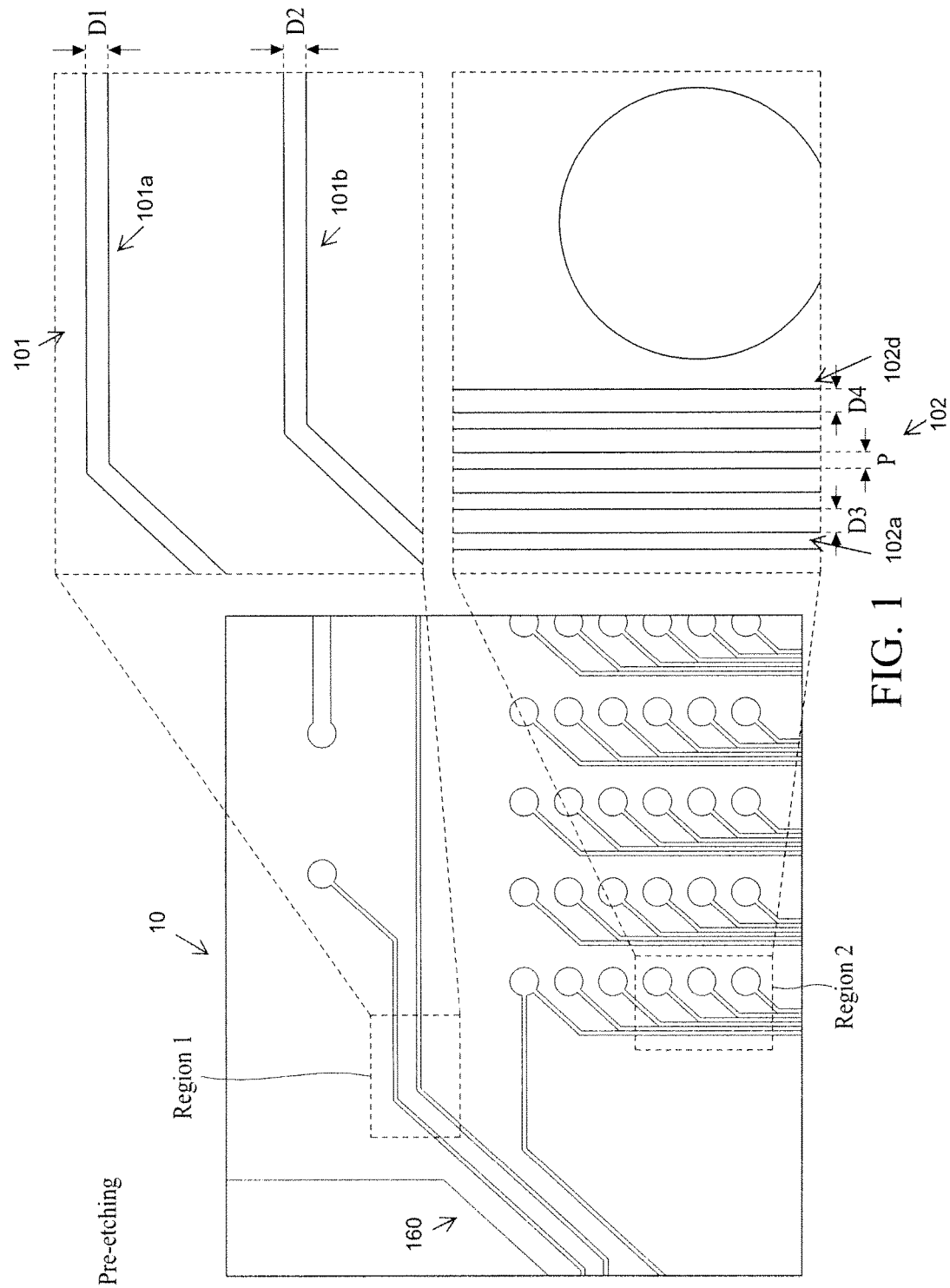
FIG. 1 shows a top view of a wiring structure prior to etching in accordance with a comparative design of a wiring structure.

FIG. 1 shows a top view of a wiring structure 10 prior to etching in accordance with a comparative design of a wiring structure. As shown in FIG. 1, the wiring structure 10 comprises a patterned conductive layer 100, which comprises a plurality of conductive lines, including first conductive lines 101 disposed in region 1 and second conductive lines 102 in region 2. The conductive lines 100 are fine conductive lines and each of the conductive lines 100 has a width (D) less than about 10 μm, such as ranging from about 2 μm to about 3 μm, and a pitch (P) between two adjacent conductive lines 100 is less than about 10 μm, such as about 2 μm. For example, as shown in magnified views of regions 1 and 2 at the right side of FIG. 1, the width (D1) of a first conductive line 101a is about 2.85 μm and the width (D2) of another first conductive line 101b is about 2.83 μm in Region 1, and the width (D3) of a second conductive line 102a is about 2.52 μm and the width (D4) of another second conductive line 102d is about 2.61 μm in Region 2, and the pitch (P) in region 2 is about 1.55 μm.

Figure 2:
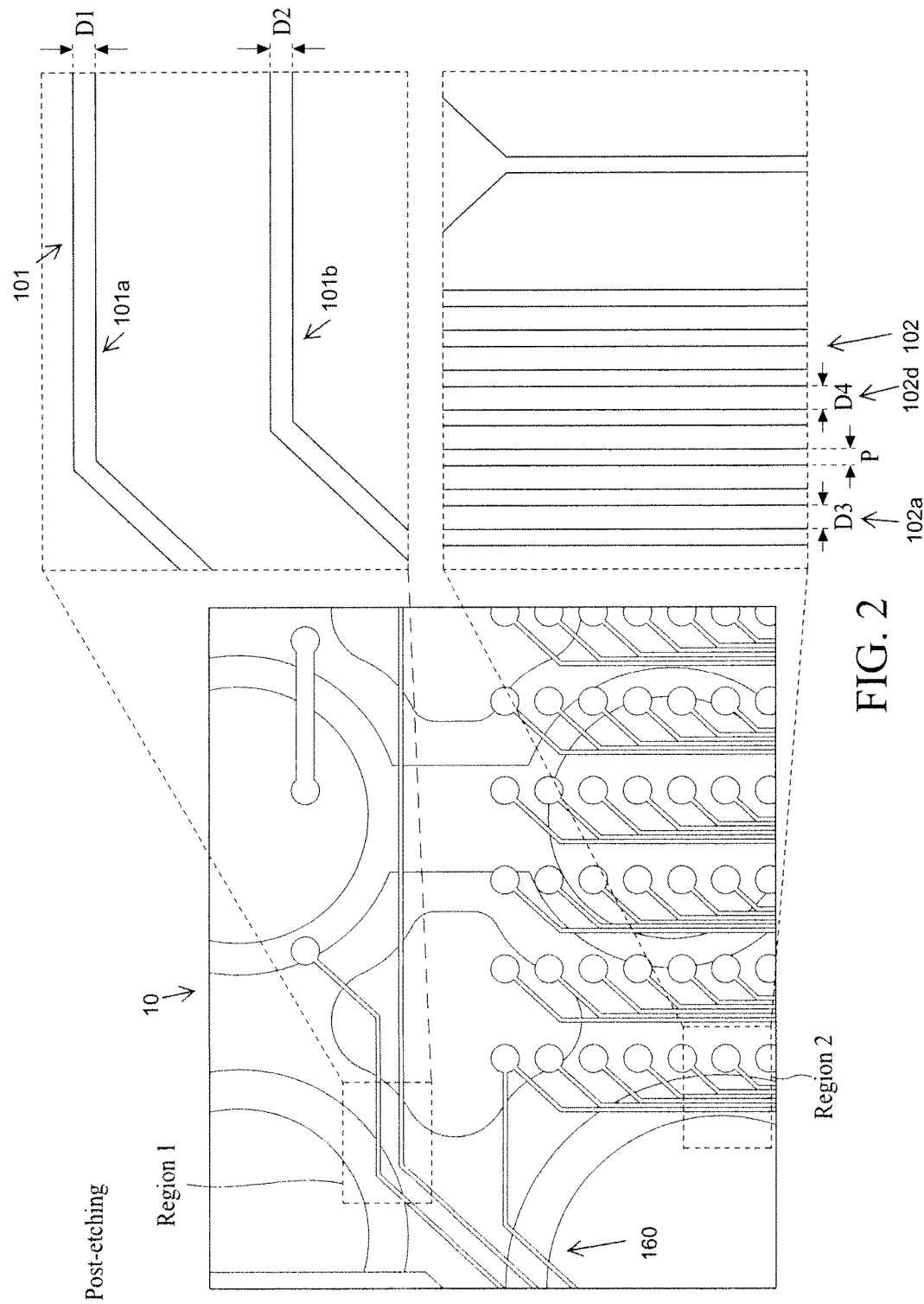
FIG. 2 shows a top view of the wiring structure depicted in FIG. 1 after etching.

FIG. 2 shows a top view of the wiring structure 10 depicted in FIG. 1 after etching. Referring to magnified views of Regions 1 and 2 at the right side of FIG. 1, the width (D1) of the conductive line 101a becomes about 1.61 μm and the width (D2) of the conductive line 101b becomes about 1.84 μm in Region 1, and the width (D3) of the conductive line 102a becomes about 2.07 μm and the width (D4) of the conductive line 102d becomes about 2.29 μm in region 2, and the pitch (P) in region 2 increases to about 1.74 μm.

In FIGS. 1 and 2, region 1 is a sparse region and region 2 is a dense region. The details of the designation of sparse regions and dense regions is discussed below. As shown in FIGS. 1 and 2, the width (which is treated here as a CD) of the first conductive lines 101 in region 1 of the wiring structure is reduced to less than about 2 μm after etching. In this case, the highest CD loss of the first conductive line, expressed as a percentage loss, can be calculated as: (2.85 μm−1.61 μm)/2.85 μm*100%=43.5%. A CD loss of 43.5% can be undesirably high (e.g. nearly 50%) in some implementations, meaning the conductive lines in the sparse region are over-etched, which may cause a high risk of peeling.

Figure 3:
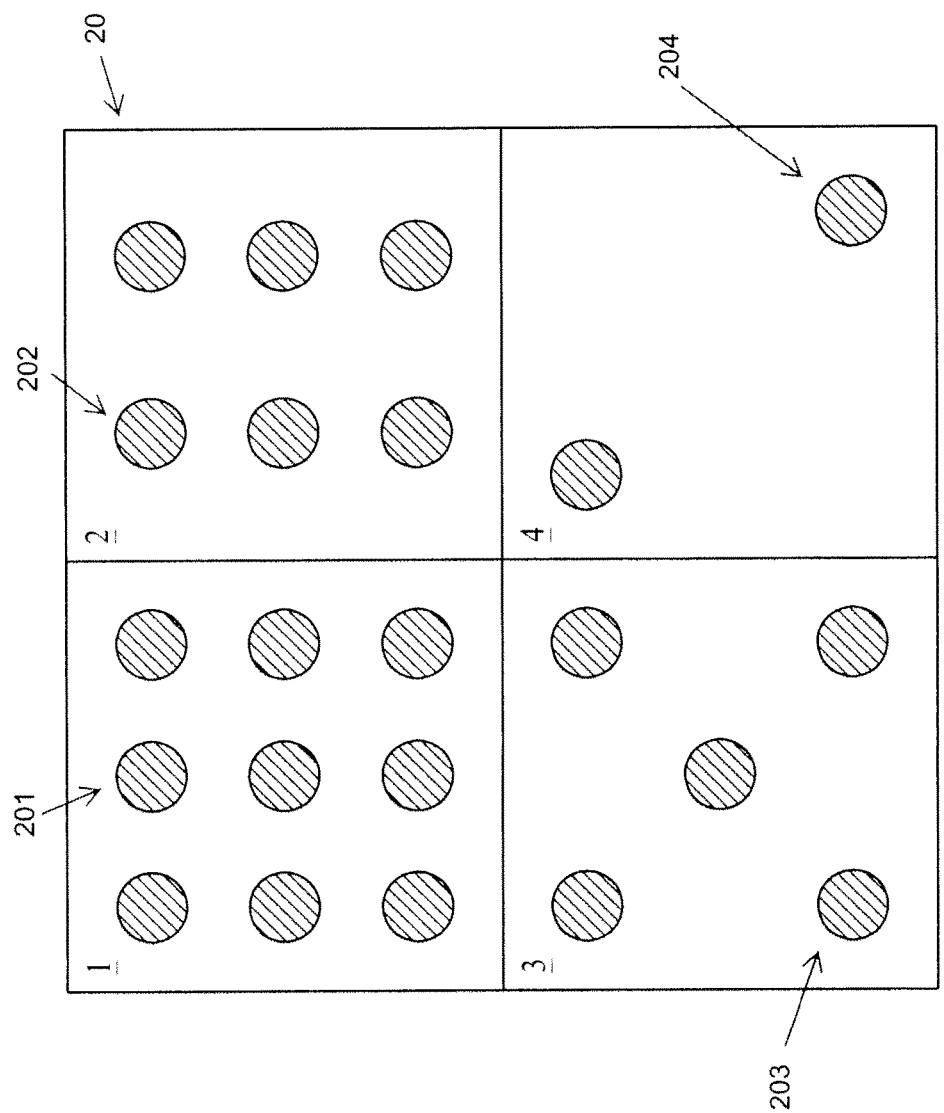
FIG. 3 illustrates a wiring structure divided into four regions in accordance with some embodiments of the present disclosure.

FIG. 3 illustrates a wiring structure 20 in accordance with some embodiments of the present disclosure. As shown in FIG. 3, the wiring structure 20 comprising a patterned conductive layer is divided (e.g. by imaginary lines) into four regions each having an approximately equal area, Regions 1, 2, 3 and 4. In the depicted example, the size of each area is set to be about 0.5% to about 3% of a shuttle plane of a photomask (e.g. used in forming the wiring structure), or a size of about 10% to about 25% of an area of a die (e.g. a footprint or an area of a top surface) that is included in a semiconductor package along with the wiring structure 20.

As depicted in FIG. 3, region 1 includes nine conductive lines 201, region 2 includes six conductive lines 202, region 3 includes five conductive lines 203, and region 4 includes two conductive lines 204. A conductive line density (S1) of region 1 is greater than a conductive line density (S2) of region 2, which is greater than a conductive line density (S3) of region 3, which is greater than a conductive line density (S4) of region 4. In other words, the conductive line density (S1) of region 1 is greatest, and the conductive line density (S4) of region 4 is smallest. According to some embodiments where a "dense region" is a region having a greatest density of conductive lines out of a set of regions, Region 1 is a dense region and regions 2 to 4 are sparse regions. Calculation of the conductive line density of a region is discussed below.

Figure 4B:
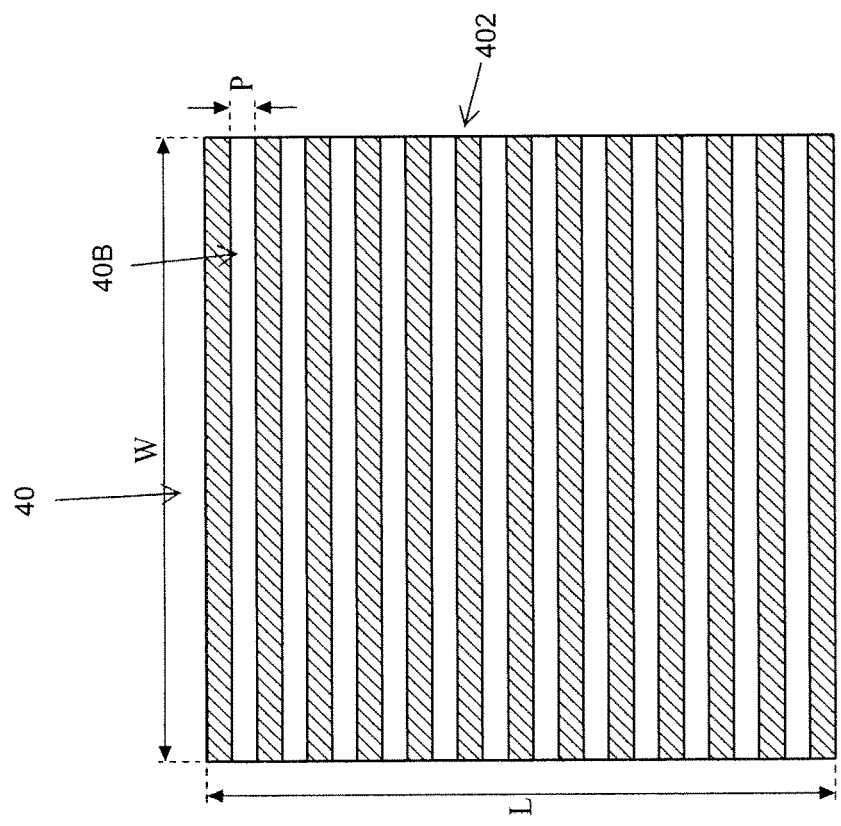
FIG. 4A and FIG. 4B illustrate different conductive line densities of an area of a wiring structure in accordance with some embodiments of the present disclosure.
Figure 4A:
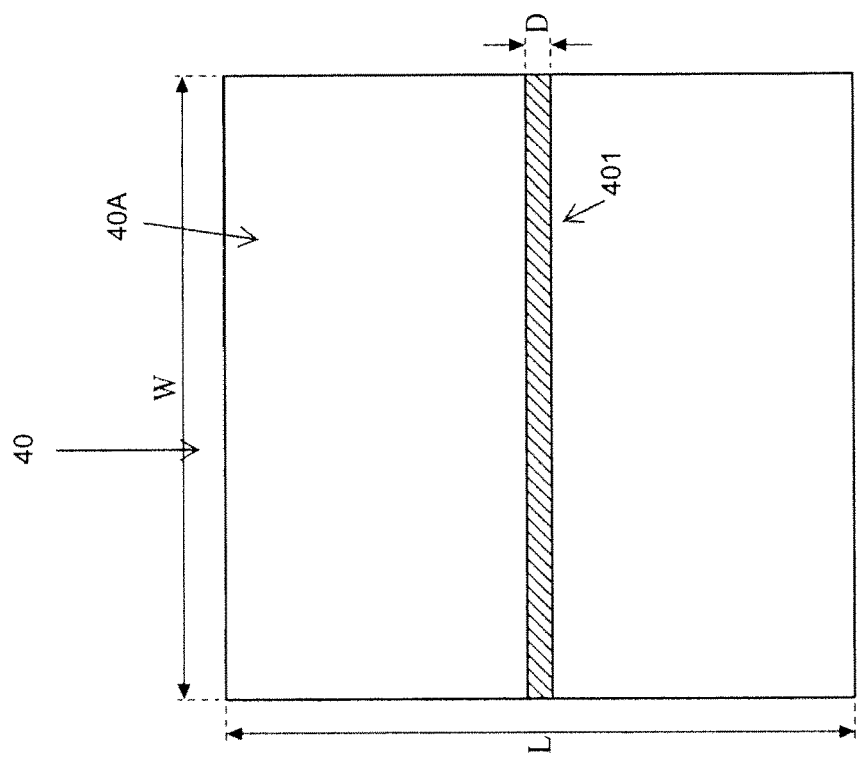

FIGS. 4A and 4B illustrate examples of respective regions 40A and 40B of a wiring structure 40, discussed here to describe one manner of calculating a conductive line density of a region in a wiring structure. In the region 40A depicted in FIG. 4A, there is a single conductive line 401. The region 40A has a length (L) of about 50 μm and a width (W) of about 50 μm, and the conductive line 401 has a length of about 50 μm and a width (D) of about 2 μm. Accordingly, the area (M) of the region is: M=L*W=50 μm*50 μm=2,500 μm². The area (M1) of the conductive line is: A1=L*D=50 μm*2 μm=100 μm². Thus, the conductive line density (S) of the region is: S=M1/M*100%=4%. The ratio (R) of the area of the Region 40A without the conductive line to the area (M) of the region is: R=1−S=96%.

Referring to region 40B depicted in FIG. 4B, conductive lines 402 are disposed approximately parallel to each other and a pitch (P) between two adjacent conductive lines 402 is about 2 μm. The region 40B has approximately the same dimensions as the region 40A, and has an approximately same area as the region 40A. The region 40B comprises 13 conductive lines. The area (M1) of the conductive lines is: M1=13*L*D=13*50 μm*2 μm=1,300 μm². Thus, the conductive line density (S) of the region is: S=M1/M*100%=52%, and the ratio (R) of the area of the region without the conductive lines to the area (M) of the region is: R=1−S=48%.

According to some embodiments in the present disclosure, if the ratio (R) of the area of the region without the conductive lines to the area (M) is less than about 96%, the region is a sparse region. Some wiring designs of the present disclosure can be implemented in a region for which the ratio (R) of the area of the Region without the conductive lines to the area (M) ranges from about 48% to about 98.6%. A ratio (R) falling in this range can be useful, in some implementations.

Figure 5B:
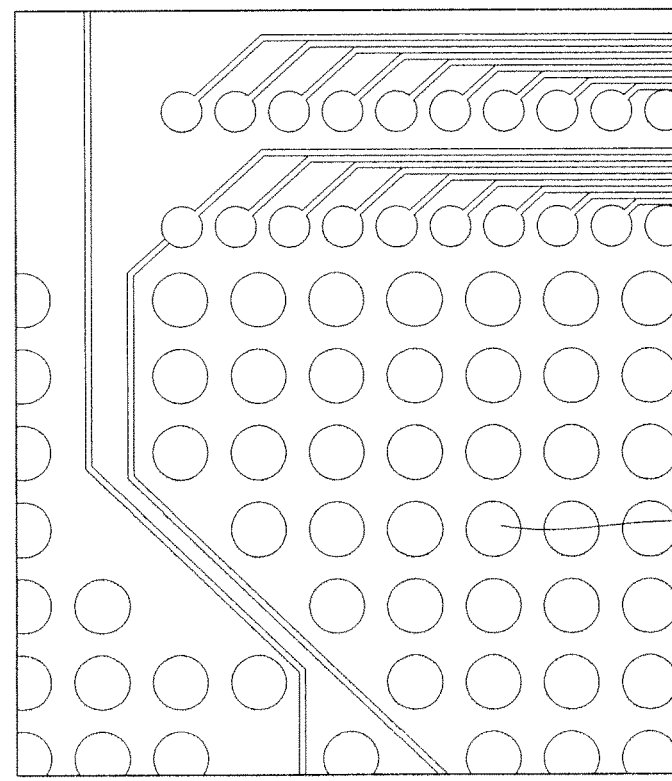
FIG. 5B illustrates a top view of the wiring structure of FIG. 5A after adding dummy conductive structures.
Figure 5A:
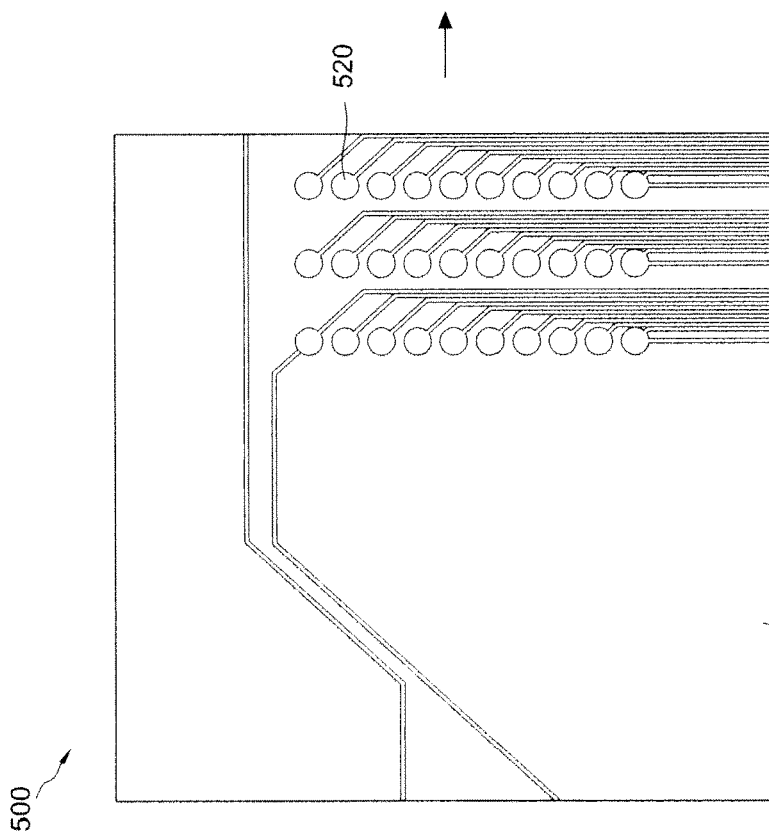
FIG. 5A illustrates a top view of a wiring structure prior to adding dummy conductive structures in accordance with some embodiments of the present disclosure.

FIG. 5A illustrates a top view of a wiring structure 500 prior to adding dummy conductive structures (e.g. non-function conductive structures, such as conductive structures that do not serve as part of a functional current path (e.g. does not electrically connect to a die), but which may serve other functions, such as providing structural support or spacing) in accordance with some embodiments of the present disclosure, while FIG. 5B illustrates a top view of the wiring structure 500 depicted in FIG. 5A after adding dummy conductive structures 530. The wiring structure 500 includes a dielectric layer 510 and a patterned conductive layer 520 that includes conductive lines, disposed on the dielectric layer 510. After a dense region and a sparse region are determined and selected, dummy conductive structures 530 are added to the wiring structure 500. In some embodiments, at least some of, or all of, the dummy conductive structures 530 are isolated from each of the conductive lines of the patterned conductive layer 520. That is, there are no electrical connections between the dummy conductive structures 530 and the conductive lines of the patterned conductive layer 520.

Figure 6:
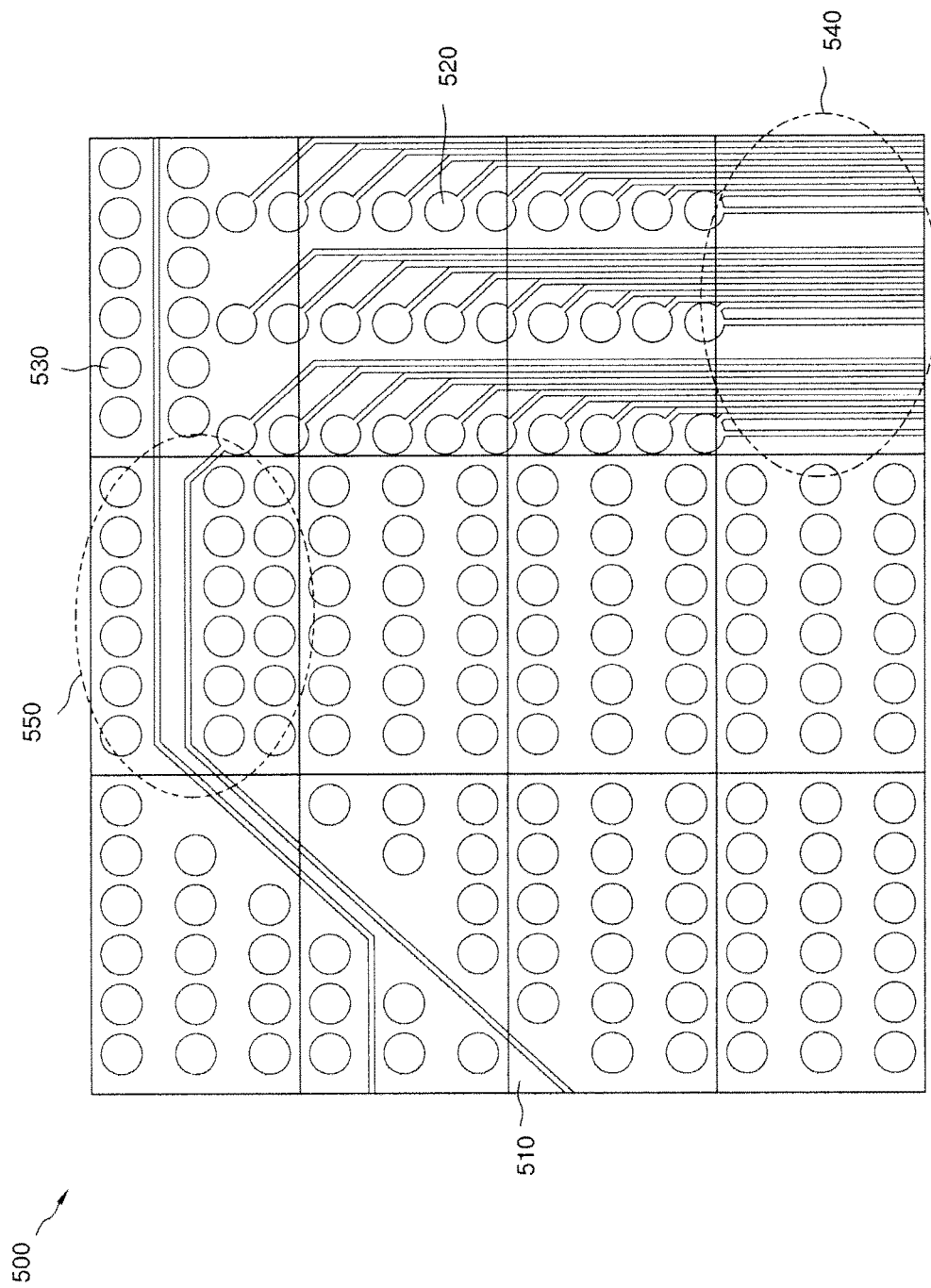
FIG. 6 illustrates a top view of a wiring structure in accordance with some embodiments of the present disclosure.

FIG. 6 illustrates a detailed diagram of a top view of the wiring structure 500 in accordance with some embodiments of the present disclosure. As shown in FIG. 6, the wiring structure 500 comprises a dielectric layer 510 and a patterned conductive layer 520 that includes conductive lines, disposed on the dielectric layer. According to some of the techniques described in the present disclosure, the wiring structure can be divided into M*N regions, where M and N are positive integers. In FIG. 6, the wiring structure 500 is divided into 12 (3*4) regions comprising a dense region 540 and sparse regions 550. The dummy conductive structures 530 are then added to one or more the sparse regions 550 of the wiring structure 500. The area ($A_D$) of the conductive lines of the dense region 540 and the area ($A_S$) of the conductive lines and the dummy conductive structures 530 of the sparse regions 550 can be calculated based on the methods described above in reference to FIGS. 4A and 4B.

According to some embodiments of the present disclosure, a ratio (T) of the area ($A_S$) of the conductive lines and the dummy conductive structures 530 of the sparse regions 550 to the area ($A_D$) of the conductive lines of the dense region 540 is set to be about 80% or greater. With such a ratio, the dummy conductive structures 530 in the sparse regions 550 can consume, absorb or otherwise use up or divert some etching solution (e.g. excessive etching solution) during an etching process. Thus, the dummy conductive structures 530 can provide for some advantages, such as preventing the conductive lines from being over-etched, controlling loss of the CD, and/or avoiding or reducing peeling of conductive lines of the wiring structure. Additionally, an etching uniformity tolerance (U) of the conductive lines can thus be set as appropriate. By way of example, one manner of calculating etching uniformity for a plurality of etch rates is by use of the following equation: etching uniformity=((highest etch rate)−(lowest etch rate))/(2×average etch rate).

The value of the ratio (T) can be set as appropriate. Additionally, in some implementations it can be useful to keep the CD loss of a conductive line to about 10% or less. According to some experimental data, if the ratio (T) is about 80%, the etching uniformity tolerance (U) of the conductive lines is less than or equal to about 9%; if the ratio (T) is about 90%, the etching uniformity tolerance (U) of the conductive lines is less than or equal to about 6%. For the ratio (T) is about 100%, the etching uniformity tolerance (U) of the conductive lines is below about 3%. Setting an appropriate ratio (T) to achieve such low etching uniformity tolerances (U) can be useful for at least some implementations.

Figure 7:
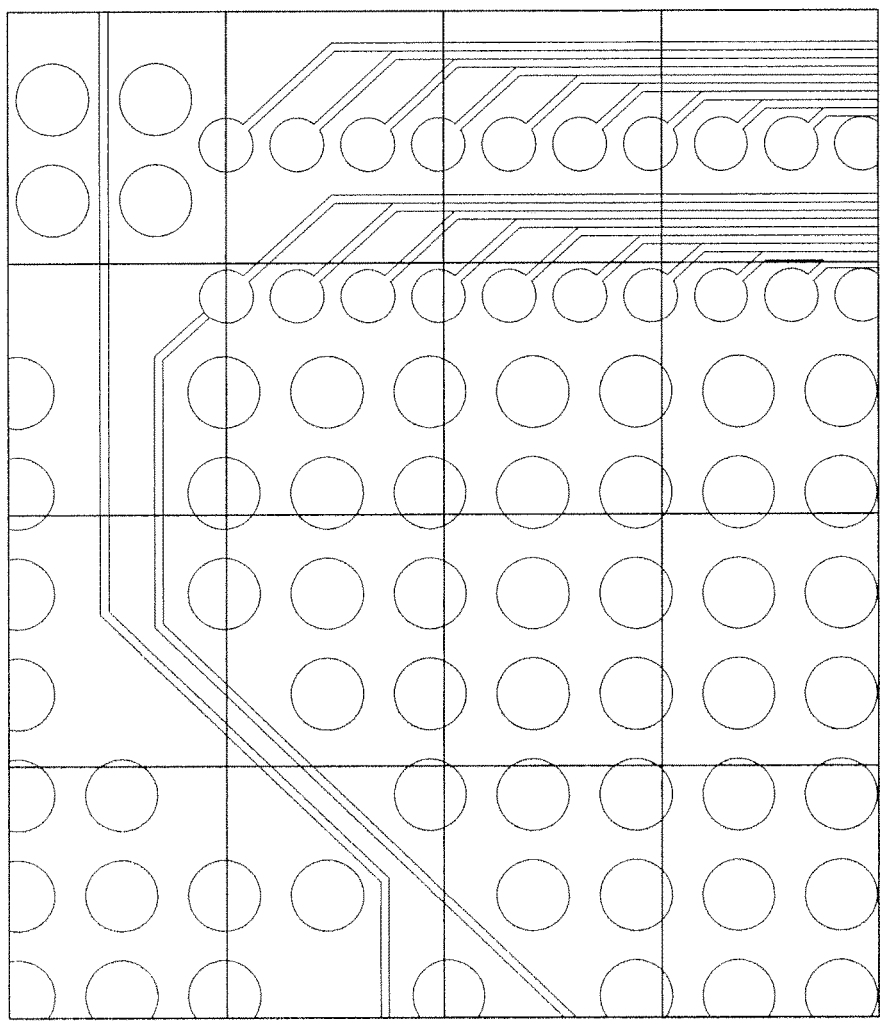
FIG. 7 illustrates a top view of a wiring structure in accordance with some embodiments of the present disclosure.

FIG. 7 illustrates a top view of a wiring structure 600 in accordance with some embodiments of the present disclosure, wherein the wiring structure 600 is divided into 16 (4*4) regions. In other implementations, a number of regions can be set based on design, use and/or manufacturing considerations. For example, for a wiring structure having an area of 10 μm² substantially filled with conductive lines, the etching uniformity tolerance (U), according to some industrial specifications, is within a range of −10% to 10%, and thus the etching uniformity tolerance (U) is: U=10 μm²*20%=2 μm². If the wiring structure is divided into 2 equal sized regions, the etching uniformity tolerance (U) of each region is: U=(10 μm²/2)*20%=1 μm²; if the wiring structure is divided into 9 equal sized regions, the etching uniformity tolerance (U) of each region is: U=(10 μm²/9)*20%=0.222 μm²; and if the wiring structure is divided into 16 equal sized regions, the etching uniformity tolerance (U) of each region is: U=(10 μm²/16)*20%=0.125 μm². Thus the uniformity tolerance (U) can be improved when more regions are provided. The greater the number of regions, the more accurate is the conductive line density (S) of the region and the wiring structure has better performance. The embodiments shown in FIG. 7 including 16 regions provide for a balance between manufacturing costs and improved etching uniformity that is desirable in some implementations.

FIG. 8 illustrates various shapes of dummy conductive structures in accordance with some embodiments of the present disclosure. As shown in FIG. 8, the shape of the dummy conductive structures can be set as appropriate, and can include, for example, any combination of polygonal, round, spherical, geometrical or alphabetical shapes.

Figure 9:
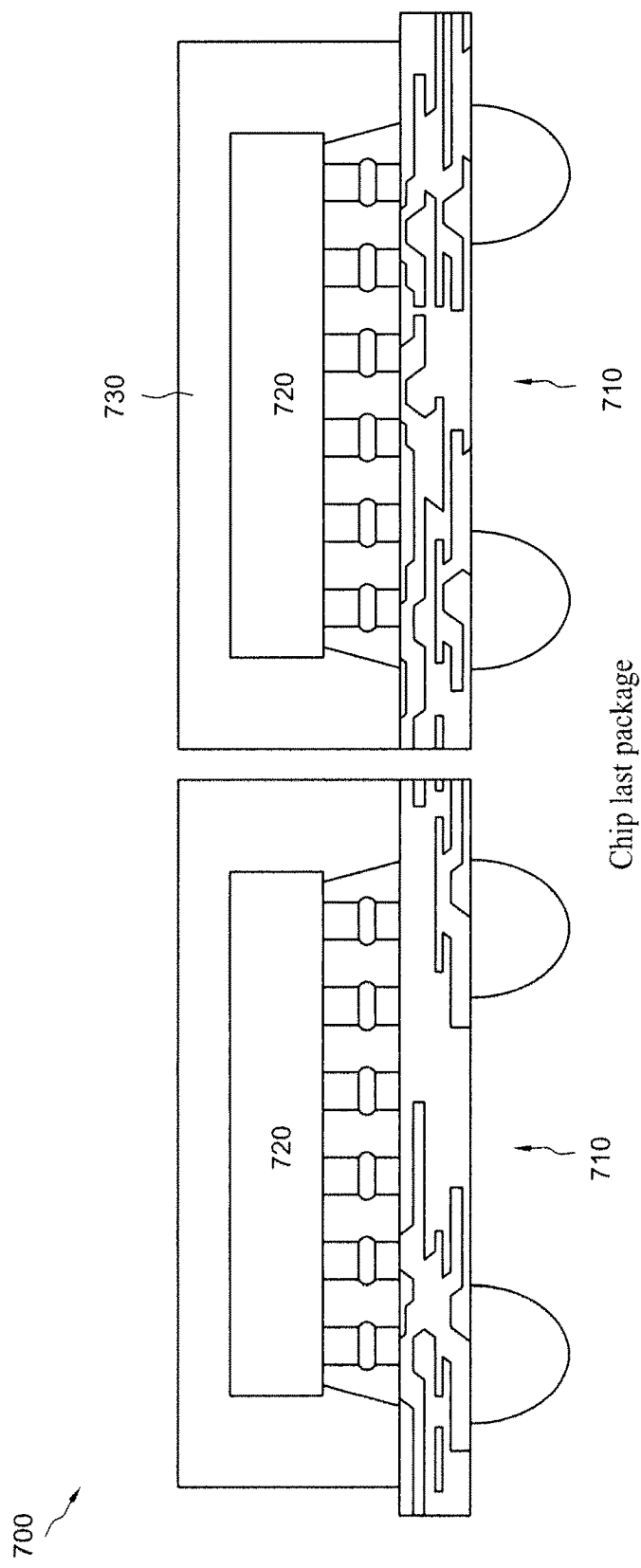
FIG. 9 illustrates a chip-last semiconductor package in accordance with some embodiments of the present disclosure.

The design of the wiring structures described in the present disclosure can be widely used in the field of semiconductor packages. FIG. 9 illustrates a semiconductor package 700 with a chip-last structure in accordance with some embodiments of the present disclosure. As shown in FIG. 9, a wiring structure 710 is provided. The wiring structure 710 can be, for example, any wiring structure described herein. At least one chip 720 is mounted on the wiring structure 710. An encapsulant layer 730 encapsulates the at least one chip 720 (e.g., a flip-chip type die or chip) to form the semiconductor package 700.

Figure 10:
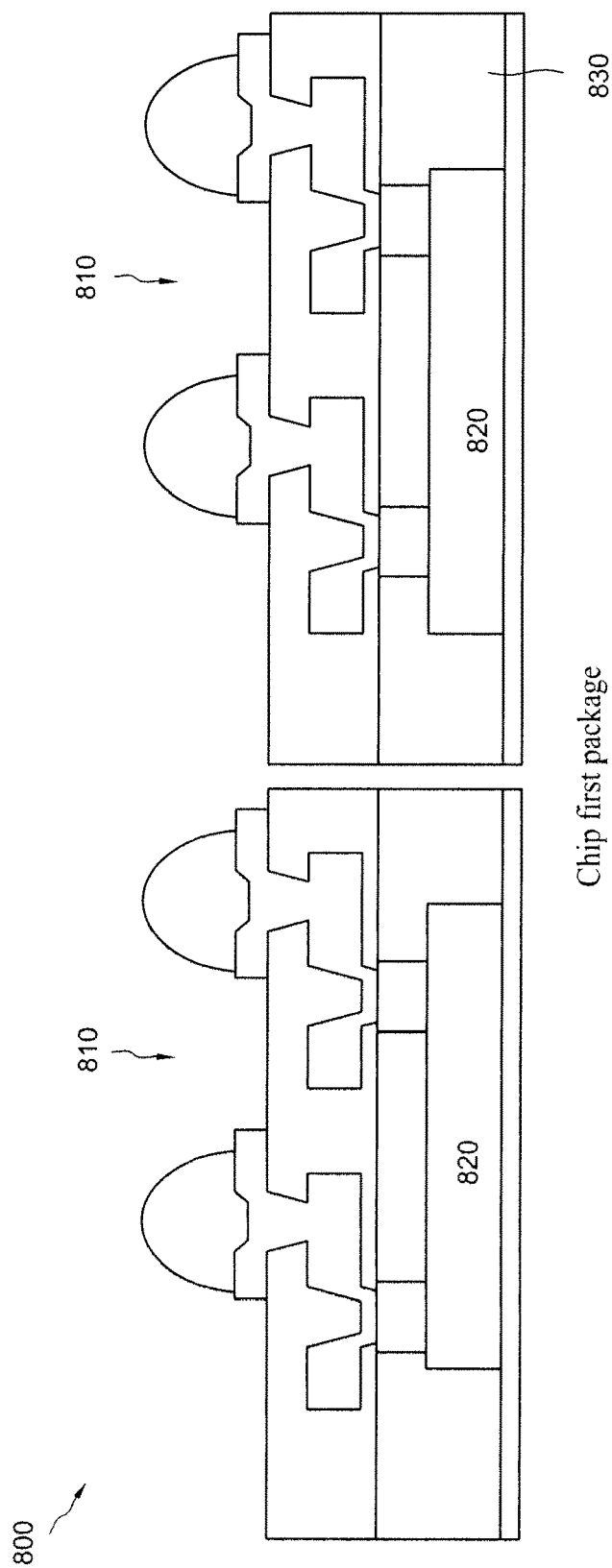
FIG. 10 illustrates a chip-first semiconductor package in accordance with some embodiments of the present disclosure.

FIG. 10 illustrates a semiconductor package 800 with a chip-first structure in accordance with some embodiments of the present disclosure. Referring to FIG. 10, at least one chip 820 is provided. An encapsulant layer 830 encapsulates the at least one chip 820. A wiring structure 810 is disposed on the encapsulant layer 830 to form the semiconductor package 800. The wiring structure 810 can be, for example, any wiring structure described herein.

In some embodiments, the semiconductor package 700 or 800 depicted in FIG. 9 or FIG. 10 includes an underfill disposed between the semiconductor die and the wiring structure 710 or 810. In some embodiments of the semiconductor package 700 or 800, the conductive lines are part of a redistribution layer. In some embodiments, the semiconductor package 700 or 800 depicted in FIG. 9 or FIG. 10 includes an under bump metallurgy disposed on the redistribution layer. In some embodiments, the semiconductor package 700 or 800 depicted in FIG. 9 or FIG. 10 includes a dielectric layer (which can include, for example, a photosensitive dielectric material). In some embodiments of the semiconductor package 700 or 800 depicted in FIG. 9 or FIG. 10, the wiring structure 710 or 810 further includes a second patterned conductive layer, wherein at least some conductive lines are electrically connected to the second patterned conductive layer.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
   a dielectric layer, comprising a first region and a second region; and
   a first patterned conductive layer on the dielectric layer, the first patterned conductive layer comprising:
      a plurality of conductive lines each having a width of less than about 10 µm, the plurality of conductive lines comprising:
         a first plurality of conductive lines disposed on the first region; and
         a second plurality of conductive lines disposed on the second region; and
      a plurality of dummy conductive structures electrically isolated from each of the plurality of conductive lines, the plurality of dummy conductive structures comprising a first plurality of dummy conductive structures disposed on the second region,
   wherein the first plurality of conductive lines occupy a first area on the first region, and the second plurality of conductive lines and the first plurality of dummy conductive structures collectively occupy a second area on the second region, and wherein a ratio of a size of the second area to a size of the first area is greater than or equal to about 80%, wherein none of the plurality of dummy conductive structures is disposed on the first region.

2. The wiring structure of claim 1, wherein each of the plurality of conductive lines has a width of about 2 µm.

3. The wiring structure of claim 1, wherein the plurality of conductive lines have a pitch of about 2 µm.

4. The wiring structure of claim 1, wherein the first region and the second region have a same area.

5. The wiring structure of claim 1, wherein at least some of the conductive lines of the plurality of conductive lines are electrically interconnected.

6. The wiring structure of claim 1, further comprising a second patterned conductive layer, wherein at least some of the plurality of conductive lines are electrically connected to the second patterned conductive layer.

7. The wiring structure of claim 1, wherein an etching uniformity tolerance of each of the plurality of conductive lines is less than about 9%.

8. The wiring structure of claim 1, wherein a ratio of the size of the second area to a size of an area of the first region is greater than or equal to about 52%.

9. The wiring structure of claim 1, wherein the second plurality of conductive lines occupy a third area, and wherein a ratio of a size of the third area to a size of an area of the second region is in a range of about 1.4% to about 52%.

10. The wiring structure of claim 1, wherein the dielectric layer further comprises a number "m" of third regions, wherein "m" is a positive integer equal to or greater than 14.

11. The wiring structure of claim 1, wherein the plurality of conductive lines are included in a redistribution layer.

12. A semiconductor package, comprising:
   a wiring structure, comprising:
      a dielectric layer, comprising a first region and a second region; and
      a first patterned conductive layer on the dielectric layer, the first patterned conductive layer comprising:
         a plurality of conductive lines each having a width of less than about 10 µm and a pitch of less than about 10 µm, the plurality of conductive lines comprising:
            a first plurality of conductive lines disposed on the first region; and
            a second plurality of conductive lines disposed on the second region; and
         a plurality of dummy conductive structures electrically isolated from each of the conductive lines, the plurality of dummy conductive structures comprising a first plurality of dummy conductive structures disposed on the second region,
      a semiconductor die electrically connected to the wiring structure; and
      an encapsulant layer encapsulating the semiconductor die,
   wherein the first plurality of conductive lines occupy a first area on the first region, and the second plurality of conductive lines and the first plurality of dummy conductive structures collectively occupy a second area on the second region, and wherein a ratio of the second area to the first area is greater than or equal to about 80%, wherein none of the plurality of dummy conductive structures are disposed on the first region, wherein none of the plurality of dummy conductive structures is disposed on the first region.

13. The semiconductor package of claim 12, wherein a size of an area of the first region or the second region is in a range of about 10% to about 25% of a size of an area of a footprint of the semiconductor die.

14. The semiconductor package of claim 12, wherein each of the plurality of conductive lines has a width of about 2 µm.

15. The semiconductor package of claim 12, wherein the plurality of conductive lines have a pitch of about 2 µm.

16. The semiconductor package of claim 12, wherein an etching uniformity tolerance of each of the plurality of conductive lines is less than about 9%.

17. The semiconductor package of claim 12, wherein a ratio of the size of the first area to a size of an area of the first region is greater than or equal to about 52%.

18. The semiconductor package of claim 12, wherein the second plurality of conductive lines occupy a third area, and wherein a ratio of the size of the third area to a size of an area of the second region is in a range of about 1.4% to about 52%.

19. The semiconductor package of claim 12, wherein the dielectric layer further comprises a number "m" of third regions, wherein "m" is a positive integer equal to or greater than 14.

20. The semiconductor package of claim 12, wherein the semiconductor die is a flip-chip type die.

21. The semiconductor package of claim 20, further comprising an underfill between the semiconductor die and the wiring structure.

22. The semiconductor package of claim 12, wherein the plurality of conductive lines are included in a redistribution layer.

23. The semiconductor package of claim 22, further comprising an under bump metallurgy (UBM) disposed on the redistribution layer.

24. The semiconductor package of claim 12, wherein the dielectric layer comprises a photosensitive dielectric material.

* * * * *